United States Patent
Lee et al.

(10) Patent No.: US 9,824,029 B2
(45) Date of Patent: Nov. 21, 2017

(54) MEMORY DEVICE AND OPERATION METHOD OF THE SAME

(71) Applicants: SK hynix Inc., Gyeonggi-do (KR); Korea University Research and Business Foundation, Seoul (KR)

(72) Inventors: Ho-Kyoon Lee, Gyeonggi-do (KR); Il Park, Gyeonggi-do (KR); Seon-Wook Kim, Gyeonggi-do (KR)

(73) Assignees: SK Hynix Inc., Gyeonggi-do (KR); Korea University Research and Business Foundation, Seoul (KR)

( * ) Notice: Subject to any disclaimer, the term of this patent is extended or adjusted under 35 U.S.C. 154(b) by 0 days.

(21) Appl. No.: 15/333,792

(22) Filed: Oct. 25, 2016

(65) Prior Publication Data
US 2017/0270054 A1  Sep. 21, 2017

(30) Foreign Application Priority Data
Mar. 16, 2016  (KR) .................. 10-2016-0031491

(51) Int. Cl.
*G11C 7/00*   (2006.01)
*G06F 12/121*  (2016.01)

(52) U.S. Cl.
CPC ........ *G06F 12/121* (2013.01); *G06F 2212/69* (2013.01)

(58) Field of Classification Search
CPC .......... G11C 5/005; G11C 29/00; G11C 29/44
USPC .................. 365/200, 230.03, 185.11
See application file for complete search history.

(56) References Cited

U.S. PATENT DOCUMENTS

| | | | | |
|---|---|---|---|---|
| 5,586,075 A * | 12/1996 | Miwa | ..................... | G11C 29/82 365/185.29 |
| 7,460,399 B1 | 12/2008 | Harari et al. | | |
| 2008/0117696 A1* | 5/2008 | Chang | ..................... | G11C 29/76 365/200 |
| 2014/0006712 A1* | 1/2014 | Tucek | ................. | G06F 12/0246 711/118 |
| 2016/0217079 A1* | 7/2016 | Lin | ..................... | G06F 12/0875 |

FOREIGN PATENT DOCUMENTS

KR    1020150027895    3/2015

* cited by examiner

*Primary Examiner* — Han Yang
(74) *Attorney, Agent, or Firm* — IP & T Group LLP

(57) ABSTRACT

A memory device includes: a main block that includes a plurality of first pages that are accessible based on a multi-bit address; and a sub-block that includes a plurality of second pages that are accessible based on a portion of bits of the multi-bit address, and stores a replacement data for replacing entire or a portion of the data of an accessed first page among the plurality of the first pages in a second page that stores the same tags as the other bits of the multi-bit address among the accessed second pages.

20 Claims, 4 Drawing Sheets

MEMORY DEVICE AND OPERATION METHOD OF THE SAME

CROSS-REFERENCE TO RELATED APPLICATIONS

The present application claims priority under 35 U.S.C §119(a) to Korean Patent Application No. 10-2016-0031491, filed on Mar. 16, 2016, which is incorporated herein by reference in its entirety.

BACKGROUND

1. Field

Exemplary embodiments of the present invention relate generally to a memory device and an operation method thereof.

2. Description of the Related Art

Nowadays, many next-generation memory devices, such as a Resistive Random Access Memory (RRAM) device, a Phase-Change Random Access Memory (PCRAM) device, a Magnetic Random Access Memory (MRAM) device, a Ferroelectric Random Access Memory (FRAM) device and the like, are being researched and developed. An Important area for these next generation devices which still requires further improvements in error occurring frequency and stability.

SUMMARY

Embodiments of the present invention are directed to a memory device whose failure may be repaired without dropping its performance.

In accordance with an embodiment of the present invention, a memory device includes: a main block that includes a plurality of first pages that are accessible based on a multi-bit address; and a sub-block that includes a plurality of second pages that are accessible based on a portion of bits of the multi-bit address, and stores a replacement data for replacing entire or a portion of the data of an accessed first page among the plurality of the first pages in a second page that stores the same tags as the other bits of the multi-bit address among the accessed second pages.

Each of the plurality of the second pages may include a plurality of sub-sets, and each of the plurality of the sub-sets may store valid information, tags, offset and replacement data.

The multi-bit address may include a bank group address, a bank address, and a normal address, and the portion of the bits of the multi-bit address may include the bank address and a portion of the normal address.

The tags may include the bank group address and the other bits of the normal address.

Each of the plurality of the sub-sets further may store link information on a third page in which additional replacement data are stored.

The main block and the sub-block may be included in one integrated circuit chip.

The main block and the sub-block are included in different integrated circuit chips.

In accordance with another embodiment of the present invention, a memory device includes: a main block that includes a plurality of main banks, each of which includes a plurality of first pages; and a sub-block that includes a plurality of sub-banks, each of which includes a plurality of second pages, a main bank to be accessed among the plurality of the main banks is selected based on a bank group address and a bank address, and a first page to be accessed in the selected main bank is selected based on a normal address, sub-banks to be accessed among the plurality of the sub-banks are selected based on the bank address, and second pages to be accessed among the selected sub-banks are selected based on a portion of bits of the normal address, and a second page that stores the same tags as the other bits of the normal address and the bank group address among the accessed second pages store replacement data that replace entire or a portion of data of the accessed first page.

In accordance with yet another embodiment of the present invention, a method for operating a memory device includes: accessing one first page among a plurality of first pages based on a multi-bit address; accessing second pages among a plurality of second pages based on a portion of bits of the multi-bit address; checking out whether there is a second page that stores the same tags as the other bits of the multi-bit address among the accessed second pages; when there is a second page that stores the same tags, providing replacement data of the second page and a portion of data of the accessed first page as read data; and when there is no second page that stores the same tags, providing the data of the accessed first page as read data.

The multi-bit address may include a bank group address, a bank address, and a normal address, and the portion of the bits of the multi-bit address may include a bank address and a portion of bits of the normal address.

BRIEF DESCRIPTION OF THE DRAWINGS

Various embodiments of the present invention will now be described in conjunction with the following figures in which.

DETAILED DESCRIPTION

Figure 1:
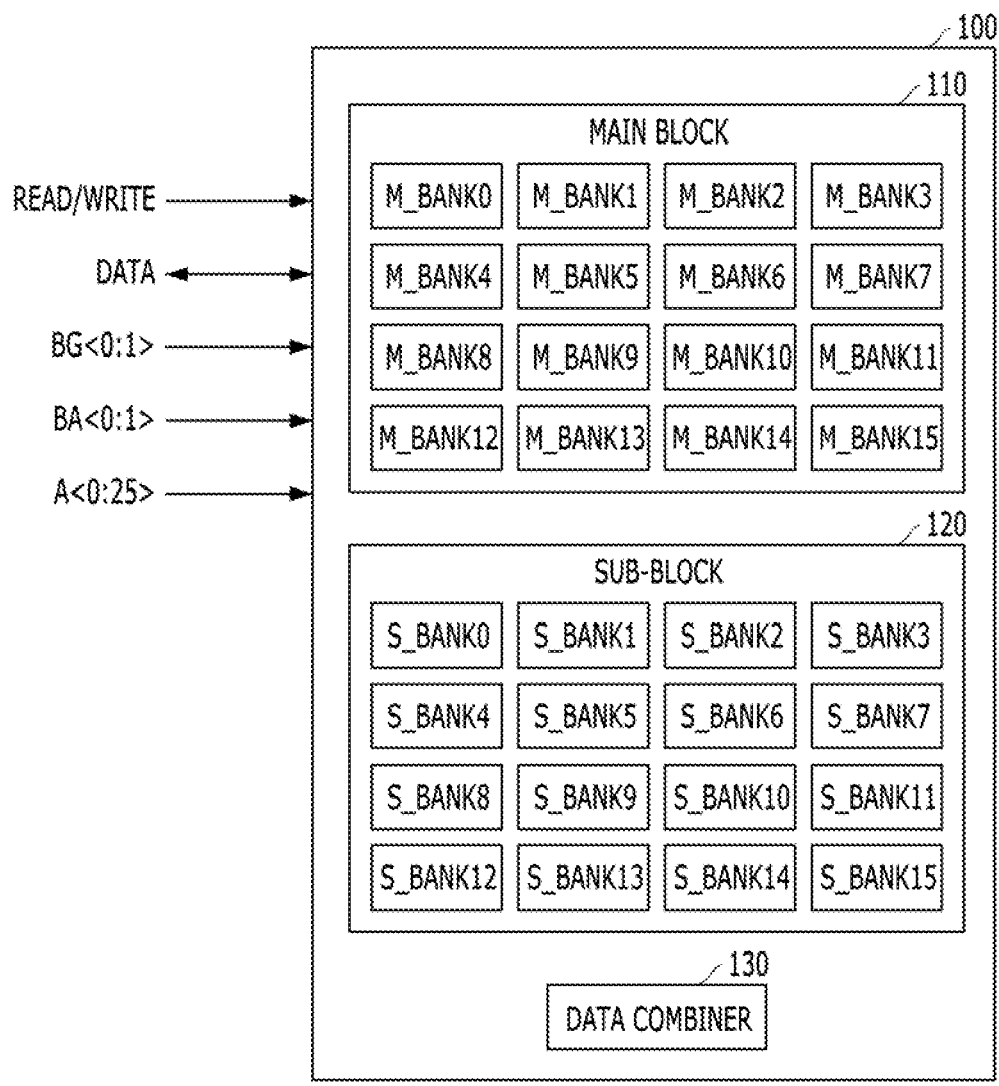
FIG. 1 is a block schematic illustration of a memory device, according to an embodiment of the present invention.

Although various embodiments of the present invention will be described below in more detail with reference to the accompanying drawings, we note that the present invention may be embodied in different forms and should not be construed as being limited to the embodiments set forth herein. Rather, these embodiments are provided so that this disclosure will be thorough and complete, and will fully convey the present invention to those skilled in the art to which the present invention belongs.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" Includes any and all combinations of one or more of the associated listed items.

In the following description, numerous specific details are set forth for providing a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

Throughout the disclosure, like reference numerals refer to like parts throughout the various figures and embodiments of the present invention.

Referring now to FIG. 1, a memory device 100 according to an embodiment of the present invention may include a main block 110, a sub-block 120, and a data combiner 130.

The main block 110 may be accessed based on a multi-bit address. The main block 110 may include a plurality of first pages. A first page among the plurality of first pages of the main block may be accessed based on the multi-bit address. The multi-bit address may, for example, include a bank group address BG<0:1>, a bank address BA<0:1>, and a normal address A<0:25>. The main block 110 may include a plurality of main banks, each bank including a plurality of first pages, each first page being capable of storing multi-bit data.

As illustrated in FIG. 1, the main block 110 may include sixteen (16) main banks M_BANK0 to M_BANK15. Moreover, for illustration purposes, each of the sixteen (16) main banks M_BANK0 to M_BANK15 may include 64 M first pages (where 1 M=1024×1024), and each of the first pages may store 128-bit data. The 16 main banks M_BANK0 to M_BANK15 may be grouped into four main bank groups. For example, the main banks M_BANK0 to M_BANK3 may belong to main bank group 0, the main banks M_BANK4 to M_BANK7 may belong to main bank group 1, the main banks M_BANK8 to M_BANK11 may belong to main bank group 2, and the main banks M_BANK12 to M_BANK15 may belong to main bank group 3.

When the main block 110 is accessed, the main bank group to be accessed may be selected based on the bank group address BG<0:1>. A main bank to be accessed may be selected from the selected bank group based on the bank address BA<0:1>. A first page to be accessed among the first pages within the selected main bank may be selected based on the normal address A<0:25>.

The sub-block 120 may be accessed based on some bits BA<0:1> and A<0:19> of the multi-bit address BG<0:1>, BA<0:1> and A<0:25>. The sub-block 120 may be a block for repairing a failure of the main block 110. The sub-block 120 may include a plurality of second pages. Among the second pages of the sub-block 120, four (4) second pages may be accessed based on some bits BA<0:1> and A<0:19> of the multi-bit address BG<0:1>, BA<0:1> and A<0:25>. For example, as illustrated the sub-block 120 may include sixteen (16) sub-banks S_BANK0 to S_BANK15, and each of the sixteen (16) sub-banks S_BANK0 to S_BANK15 may include 1 M second pages. Each of the second pages may be formed of 128 bits and include four sub-sets for storing different type of information. For example, each of the sub-sets may store validity information, tags, offset, and replacement data. The 16 sub-banks S_BANK0 to S_BANK15 may be grouped into four sub-bank groups. For example, the sub-banks S_BANK0 to S_BANK3 may belong to sub-bank group 0, the sub-banks S_BANK4 to S_BANK7 may belong to sub-bank group 1, the sub-banks S_BANK8 to S_BANK11 may belong to sub-bank group 2, and the sub-banks S_BANK12 to S_BANK15 may belong to sub-bank group 3.

When the sub-block 120 is accessed, the bank address BA<0:1> may be used to select a sub-bank to be accessed, and the bank group address BG<0:1> may not be used. Therefore, when the sub-block 120 is accessed, one sub-bank for each sub-bank group among the 16 sub-banks S_BANK0 to S_BANK15 may be selected to be accessed, resulting in four sub-banks in total. For example, the sub-banks S_BANK0, S_BANK4, S_BANK8 and S_BANK12 may be accessed together, or the sub-banks S_BANK1, S_BANK5, S_BANK9 and S_BANK13 may be accessed together, or the sub-banks S_BANK2, S_BANK6, S_BANK10 and S_BANK14 may be accessed together, or the sub-banks S_BANK3, S_BANK7, S_BANK11 and S_BANK15 may be accessed together. The second pages to be accessed based on a portion A<0:19> of the bits of the normal address may be selected from each of the four sub-banks that are selected based on the bank address BA<0:1>. As a result, a total of four second pages, which is one for each of the selected four sub-banks, may be selected.

When there is a sub-set that stores the same tags as the remaining bits BG<0:1> and A<20:25> of the multi-bit address among the sub-sets of the accessed four second pages, replacement data stored in the sub-set may replace a portion of the data of a first page accessed in the main block 110. When there is no sub-set that stores the same tags as the remaining bits BG<0:1> and A<20:25> of the multi-bit address among the sub-sets of the accessed four second pages, it may imply that there is no failure in the first page accessed in the main block 110.

When there is no failure in the first page accessed in the main block 110, the data combiner 130 may provide the data of the accessed first page as read data. When there is a failure in the accessed first page of the main block 110, the data combiner 130 may replace a portion of the data read out of the accessed first page with the replacement data stored in the second page accessed in the sub-block 120 to provide the replacement data as read data.

'DATA' shown in FIG. 1 may represent a write data inputted into the memory device 100 and a read data outputted from the memory device 100. Also, 'READ/WRITE' shown in FIG. 1 may represent a read command and/or a write command inputted into the memory device 100.

In an embodiment, the main block 110, the sub-block 120, and the data combiner 130 of the memory device 100 may be included in a single integrated circuit chip. In another embodiment, the main block 110, the sub-block 120, and the data combiner 130 of the memory device 100 may be included in different integrated circuit chips.

Although FIG. 1 illustrates that the number of the main banks M_BANK0 to M_BANK15 and the number of the sub-banks S_BANK0 to S_BANK15 are the same, it is noted that the number of the main banks M_BANK0 to M_BANK15 and the number of the sub-banks S_BANK0 to S_BANK15 may be different in a variation of the present embodiment.

Figure 2:
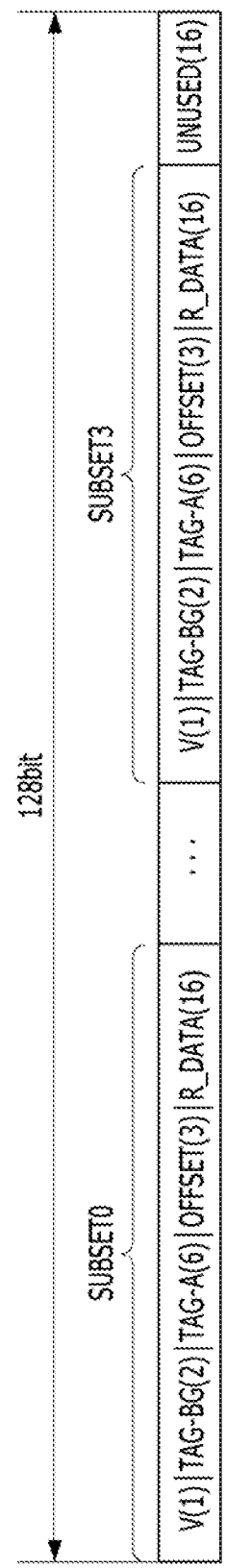
FIG. 2 illustrates an example of information stored in a second page of a sub-block of the memory device of FIG. 1.

Referring now to FIG. 2 an example of information stored in the second page of the sub-block 120 shown in FIG. 1 is provided. In FIG. 2, the numbers in parenthesis refer to the number of bits.

According to FIG. 2, the second page may be formed of 128 bits, and include four sub-sets SUBSET0 to SUBSET3. Each of the four sub-sets SUBSET0 to SUBSET3 may be formed of 28 bits, and 16 bits among the 128 bits of the second page may not be used, i.e., may be unused bits (UNUSED).

Validity information V stored in each of the four sub-sets SUBSET0 to SUBSET3 may indicate whether the data stored in the corresponding sub-set are valid or not. The validity information V may be one-bit information. For example, when the validity information V has a value of '0', the validity information V may indicate that the data stored in the corresponding sub-set is invalid, which means that the corresponding sub-set has not been used yet. When the validity information V has a value of '1', the validity information V may indicate that the data stored in the corresponding sub-set is valid, which means that the corresponding sub-set has been used.

The tags TAG-BG and TAG-A stored in the sub-sets SUBSET0 to SUBSET3 may include a bank group address tag TAG-BG and a normal address tag TAG-A. The tags TAG-BG and TAG-A may be of 8 bits, two bits of which may be occupied by the bank group address tag TAG-BG and 6 bits of which may be occupied by the normal address tag TAG-A. The sub-set that stores the same tags as the remaining bits BG<0:1> and A<20:25> except some bits BA<0:1> and A<0:19> of the address used to access the sub-block 120 among the entire address BG<0:1>, BA<0:1> and A<0:25> used to access the main block 110 may be a sub-set for storing the replacement data capable of replacing a portion of the data of the first page of the main block 110.

'OFFSET' stored in the sub-sets SUBSET0 to SUBSET3 may indicate an offset of the 16-bit replacement data R_DATA for the 128-bit data stored in the first page of the main block 110. The offset OFFSET may be of three bits. The 128 bits are divided into eight (8) parts, each of which has 16 bits. The offset OFFSET may indicate which part of the 8 parts of the 128-bit data is replaced with the 16-bit replacement data R_DATA.

The replacement data R_DATA stored in the sub-sets SUBSET0 to SUBSET3 may be data for replacing a failure portion among the 128-bit data stored in the first page of the main block 110. The replacement data R_DATA may be of 16 bits.

Hereafter, various operations of the memory device 100 is described.

First, a write operation of the memory device 100 is described.

During a write operation of the memory device 100, one first page may be accessed in the main block 110 based on a multi-bit address BG<0:1>, BA<0:1> and A<0:25>, and four second pages may be accessed in the sub-block 120 based on some bits BA<0:1> and A<0:19> of the multi-bit address. When there is no failure in the first page accessed in the main block 110, a write data of 128 bits may be stored in the accessed first page in the main block 110. When there is a failure in the first page accessed in the main block 110, one sub-set whose validity information V has a value of '0' may be selected among the sub-sets of the four second pages accessed in the sub-block 120. Then, the validity information V of the selected sub-set may be changed to a value of '1', and the remaining bits BG<0:1> and A<20:25> of the multi-bit address may be recorded in the tags TAG-BG and TAG-A of the selected sub-set. Further, the replacement data R_DATA and the offset indicating the position of the replacement data R_DATA may be recorded. In other words, when there is a failure in the first page of the main block 110, the write data may be recorded only in the parts without the failure among the eight (8) parts of the first page, and the data to be recorded in the part with the failure among the eight (8) parts of the first page may be recorded in the second page of the sub-block 120.

Hereafter, a read operation of the memory device 100 is described with reference to FIG. 3.

First, in step S310, one first page may be accessed in the main block 110 based on the multi-bit address BG<0:1>, BA<0:1> and A<0:25>.

In step S320, the sub-block 120 may be accessed, for example four second pages of the sub-block may be accessed, based on some bits BA<0:1> and A<0:19> of the multi-bit address. Access to the main block 110 and to the sub-block 120 may be performed concurrently.

In step S330, it may be checked out whether there is a sub-set storing the same tags as the remaining bits BG<0:1> and A<20:25> of the multi-bit address among the sub-sets of the accessed four second pages.

When there is no sub-set storing the same tags as the remaining bits BG<0:1> and A<20:25> of the multi-bit address, as denoted with "N" in step S330, the data combiner 130 may provide the data read out of the first page of the main block 110 as the read data of the memory device 100 in step S340.

When there is a sub-set storing the same tags as the remaining bits BG<0:1> and A<20:25> of the multi-bit address (denoted with "Y" in step S330), the data combiner 130 may replace a portion of the data read out of the first page of the main block 110 with the replacement data R_DATA stored in the sub-set storing the same tags as the remaining bits BG<0:1> and A<20:25> of the multi-bit address to provide the resultant data as the read data in step S350. Herein, the portion to be replaced with the replacement data R_DATA among the data read out of the first page may be decided based on the offset OFFSET.

Figure 3:
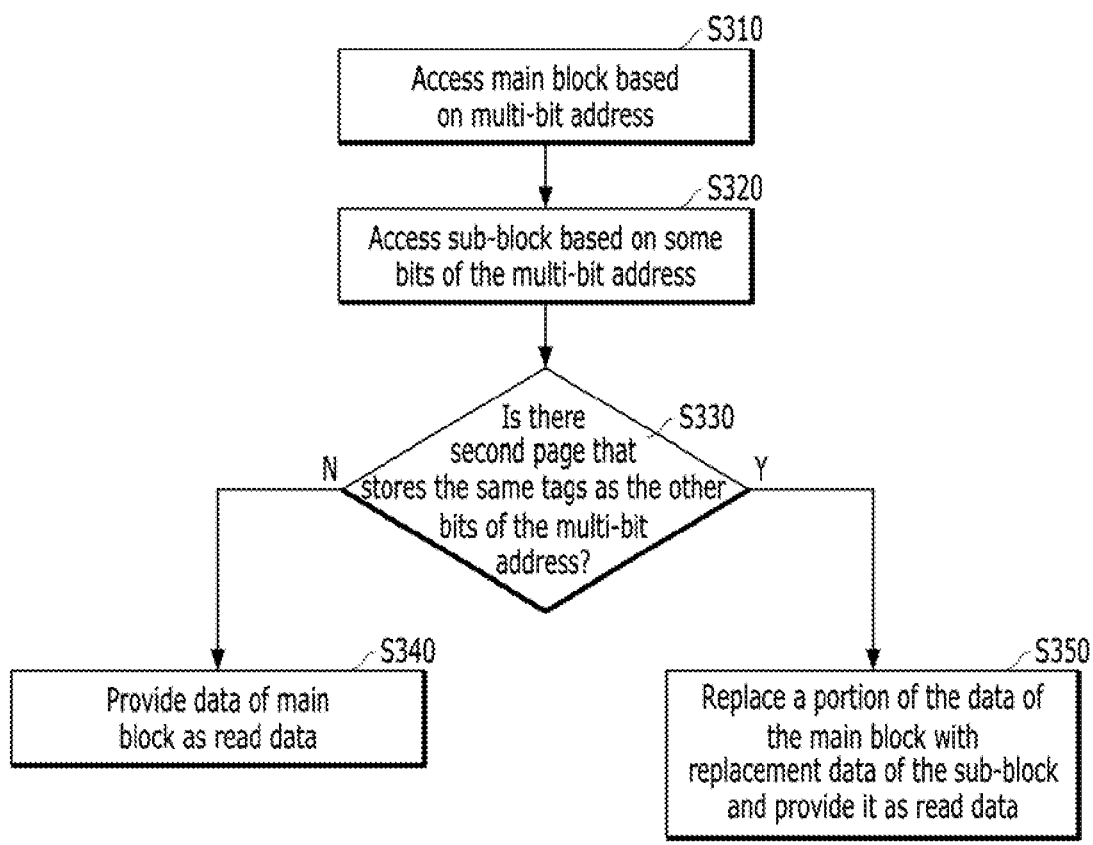
FIG. 3 is a flowchart describing a read operation of a memory device, according to an embodiment of the present invention.

It may be seen from the flowchart of FIG. 3, that when the main block 110 and the sub-block 120 are accessed concurrently and the sub-block 120 has the replacement data R_DATA for compensating for the failure of the main block 110, a portion of the data stored in the main block 110 may be replaced with the replacement data R_DATA stored in the sub-block 120. In this manner, the failure of the memory device 100 may be repaired without performance degradation.

Figure 4:
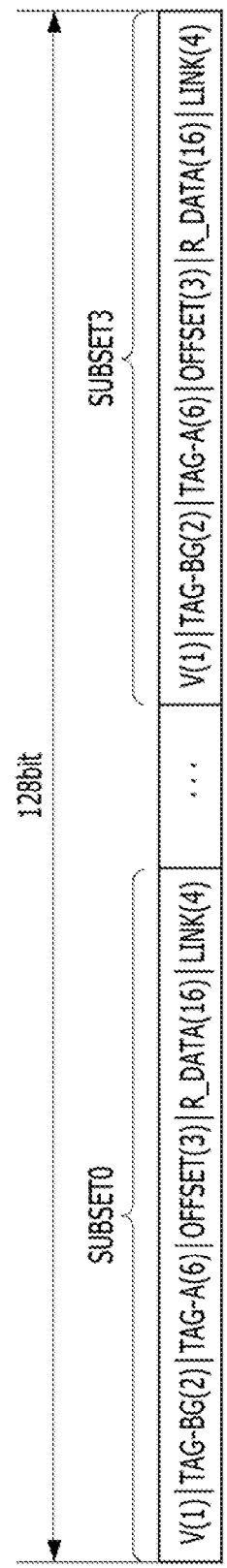
FIG. 4 illustrates another example of Information stored in the second page of a sub-block of FIG. 1.

FIG. 4 illustrates another example of information stored in the second page of the sub-block 120. Referring to FIG. 4, the second page may be formed of 128 bits and include four sub-sets SUBSET0 to SUBSET3. Each of the sub-sets SUBSET0 to SUBSET3 may be formed of 32 bits.

Each of the sub-sets SUBSET0 to SUBSET3 may store link information LINK in addition to the validity information V, the tags TAG-BG and TAG-A, the offset OFFSET, and the replacement data R_DATA. Herein, it is illustrated in FIG. 4 that the link information LINK occupies four bits.

Each of the sub-sets SUBSET0 to SUBSET3 may include 16 bits of replacement data R_DATA. If a failure occurs in the entire first page, in other words, if all the 128 bits are failure, all the replacement data R_DATA for replacing the 128 bits of the first page may not be stored in the sub-set. In this case, the link information LINK is needed. The link information LINK may be used to designate a third page of the sub-block 120 where 112-bit replacement data can be stored, except for the 16-bit replacement data R_DATA stored in the sub-set. In addition to the second pages, the sub-block 120 may further include third pages for storing the 112-bit replacement data that are not stored in the second pages. The third pages of the sub-block 120 may be accessed based on the link information LINK. For example, since the link information LINK is illustrated as an example to occupy four bits in FIG. 4, there may be 16 third pages capable of being accessed based on the link information LINK in the sub-block 120.

Referring to FIG. 4, the use of the link information LINK allows not only a portion (e.g., 16 bits) of the data stored in the first page of the main block 110 but also the entire data (which is 128 bits) stored in the first page of the main block 110 to be replaced with the replacement data stored in the sub-block 120.

According to the embodiments of the present invention, the failure of a memory device may be repaired without dropping the performance of the memory device.

While the present invention has been described with respect to the aforementioned specific embodiments, it will be apparent to those skilled in the art that various changes and modifications may be made without departing from the spirit and scope of the invention as defined in the following claims.

What is claimed is:

1. A memory device, comprising:
   a main block including a plurality of first pages accessible based on a multi-bit address; and
   a sub-block including a plurality of second pages accessible based on some bits of the multi-bit address, and suitable for storing replacement data for replacing a portion of data of an accessed first page among the plurality of first pages in a second page that stores the same tags as remaining bits of the multi-bit address among accessed second pages,
   wherein each of the plurality of second pages includes a plurality of sub-sets, and each of the plurality of sub-sets stores validity information, tags, offset indicating which portion of the data of the accessed first page is to be replaced, and the replacement data.

2. The memory device of claim 1, wherein the multi-bit address includes a bank group address, a bank address, and a normal address, and the some bits of the multi-bit address includes the bank address and some bits of the normal address.

3. The memory device of claim 2, wherein the tags include the bank group address and remaining bits of the normal address.

4. The memory device of claim 1, wherein each of the plurality of sub-sets further stores link information on a third page in which additional replacement data is stored.

5. The memory device of claim 1, wherein the main block and the sub-block are included in one integrated circuit chip.

6. The memory device of claim 1, wherein the main block and the sub-block are included in different integrated circuit chips.

7. The memory device of claim 1, further comprising:
   a data combiner suitable for providing the data of the accessed first page as read data when there is no failure in the accessed first page of the main block during a read operation, and suitable for replacing a portion of the data of the accessed first page with the replacement data stored in the accessed second page of the sub-block so as to produce replaced data and to provide the replaced data as read data, when there is a failure in the accessed first page of the main block during the read operation.

8. The memory device of claim 1, wherein each of the plurality of second pages and each of the first pages have the same size.

9. A memory device, comprising:
   a main block including a plurality of main banks, each of which includes a plurality of first pages; and
   a sub-block including a plurality of sub-banks, each of which includes a plurality of second pages,
   wherein a main bank to be accessed among the plurality of main banks is selected based on a bank group address and a bank address, and a first page to be accessed in the selected main bank is selected based on a normal address,
   wherein sub-banks to be accessed among the plurality of sub-banks are selected based on the bank address,
   wherein second pages to be accessed in each of the selected sub-banks are selected based on some bits of the normal address,
   wherein a second page storing the same tags as remaining bits of the normal address and the bank group address among the accessed second pages stores replacement data replacing a portion of data of the accessed first page, and
   wherein each of the plurality of second pages includes a plurality of sub-sets, and each of the plurality of sub-sets stores validity information, tags, offset indicating which portion of the data of the accessed first page is to be replaced, and the replacement data.

10. The memory device of claim 9, wherein each of the plurality of sub-sets further stores link information on a third page that further stores additional replacement data.

11. The memory device of claim 9, wherein the main block and the sub-block are included in one integrated circuit chip.

12. The memory device of claim 9, wherein the main block and the sub-block are included in different integrated circuit chips.

13. The memory device of claim 9, further comprising:
   a data combiner suitable for providing data of the accessed first page as read data when there is no failure in the accessed first page of the main block during a read operation, and suitable for replacing a portion of the data of the accessed first page with the replacement data stored in the accessed second page of the sub-block so as to produce replaced data and to provide the replaced data as read data, when there is a failure in the accessed first page of the main block during the read operation.

14. The memory device of claim 9, wherein each of the plurality of second pages and each of the first pages have the same size.

15. A method for operating a memory device, comprising:
    accessing one first page among a plurality of first pages based on a multi-bit address;
    accessing second pages among a plurality of second pages based on some bits of the multi-bit address;
    checking out whether there is a second page that stores the same tags as remaining bits of the multi-bit address among the accessed second pages;
    providing replacement data of the second page and a portion of data of the accessed first page as read data, when there is a second page that stores the same tags; and
    providing the data of the accessed first page as read data, when there is no second page that stores the same tags,
    wherein each of the plurality of second pages includes a plurality of sub-sets, and each of the plurality of sub-sets stores validity information, tags, offset indicating which portion of the data of the accessed first page is to be replaced, and the replacement data.

16. The method of claim 15, wherein the multi-bit address includes a bank group address, a bank address, and a normal address, and
    the some bits of the multi-bit address includes a bank address and some bits of the normal address.

17. The method of claim 16, wherein each of the plurality of sub-sets further stores link information on a third page in which additional replacement data is stored.

18. The method of claim 17, further comprising:
    checking out as to whether each of the plurality of sub-sets stores the link information; and
    additionally providing the additional replacement data stored in the third page as the read data.

19. The method of claim 18, wherein only the additional replacement data stored in the third page and the replacement data stored in the second page are provided as the read data.

20. The method of claim 15, wherein each of the plurality of second pages and each of the first pages have the same size.

* * * * *